(12) United States Patent
Lv et al.

(10) Patent No.: US 10,749,540 B2
(45) Date of Patent: Aug. 18, 2020

(54) MICROWAVE RESONANT CAVITY FOR LASER COOLING, MICROWAVE INTERROGATION AND ATOMIC STATE DETECTION IN SITU

(71) Applicant: Shanghai Institute of Optics And Fine Mechanics, Chinese Academy of Sciences, Shanghai (CN)

(72) Inventors: Desheng Lv, Shanghai (CN); Zhen Zhang, Shanghai (CN); Xinwen Wang, Shanghai (CN); Wei Ren, Shanghai (CN); Xiangkai Peng, Shanghai (CN); Kangkang Liu, Shanghai (CN); Jingfeng Xiang, Shanghai (CN); Liang Liu, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 16/362,588

(22) Filed: Mar. 22, 2019

(65) Prior Publication Data

US 2020/0076441 A1  Mar. 5, 2020

(30) Foreign Application Priority Data

Aug. 30, 2018 (CN) .......................... 2018 1 0999364

(51) Int. Cl.
*H03L 7/26* (2006.01)
*G04F 5/14* (2006.01)
*H03B 17/00* (2006.01)

(52) U.S. Cl.
CPC ................. *H03L 7/26* (2013.01); *G04F 5/14* (2013.01); *H03B 17/00* (2013.01)

(58) Field of Classification Search
CPC .. G04F 5/14; H03L 7/26; H03B 17/00; H05H 3/02; H05H 7/14
See application file for complete search history.

(56) References Cited

U.S. PATENT DOCUMENTS 5,528,028 A * 6/1996 Chu .......................... G04F 5/14
                                                        250/251
7,944,317 B2 * 5/2011 Strabley ................... G04F 5/14
                                                        250/251

(Continued)

FOREIGN PATENT DOCUMENTS

CN          106773611 A   *   5/2017

OTHER PUBLICATIONS

Lo, Desheng, et al. "Design of a space atomic clock with intracavity cooling." 2017 Joint Conference of the European Frequency and Time Forum and IEEE International Frequency Control Symposium (EFTF/IFCS). IEEE, 2017. (Year: 2017).*

*Primary Examiner* — Ryan Johnson
(74) *Attorney, Agent, or Firm* — Mei & Mark LLP; Manni Li

(57) ABSTRACT

A microwave resonant cavity for laser cooling, microwave interrogation, and atomic state detection, comprising a microwave resonant cavity body, two cutoff waveguide end covers, and four waveguides for laser beams and microwave coupling. The cavity feeds not only microwave but also laser beams into the center of the cavity. In a vacuum chamber with target atoms, the target atoms may be trapped and cooled in the center of the cavity. By sequential operation of the resonant microwave and lasers, the microwave resonant cavity of the present invention may manipulate and detect the atomic state population and interrogate the energy level of the cold atoms in situ. The invention may be applied to the fields of atomic frequency standard, interferometer and (Continued)

atomic gyro for developing the miniaturized cold atoms related precision measurement equipment.

6 Claims, 3 Drawing Sheets

(56) References Cited

U.S. PATENT DOCUMENTS

| | | | |
|---|---|---|---|
| 9,083,363 B2 * | 7/2015 | Fertig | G04F 5/14 |
| 9,410,885 B2 * | 8/2016 | Schober | G01D 11/245 |
| 2002/0125418 A1 * | 9/2002 | Kajita | G21K 1/006 |
| | | | 250/251 |

* cited by examiner

MICROWAVE RESONANT CAVITY FOR LASER COOLING, MICROWAVE INTERROGATION AND ATOMIC STATE DETECTION IN SITU

CROSS-REFERENCE TO RELATED APPLICATION

The subject application claims priority on Chinese patent application CN201810999364.3 filed on Aug. 30, 2018 in China. The contents and subject matter of the Chinese priority application is incorporated herein by reference.

BACKGROUND OF INVENTION

Technical Field

The present invention relates to atomic clocks, in particular, a microwave resonant cavity clock operating in space microgravity environment for laser cooling, microwave interrogation, and atomic state detection.

Description of Related Art

In 1967, the definition of "a second" was modified to the transition of cesium atom's hyperfine levels on the ground state, that is, the duration of 9192631770 cycles between two hyperfine levels on the ground state of the uninterrupted $^{133}Cs$ atom is one second. Since then, several types of atomic clock have been invented and their performances upgrading constantly. Till now, the accuracy of cesium fountain clocks has reached the level of $2\sim3\times10^{-16}$. Many other types of atomic clocks, such as rubidium clock, cesium beam clock, and passive hydrogen maser, have been used in the Global Navigation Satellite System (GNSS).

The performance improvement of atomic clocks and the application of cold atoms have been extended to the space microgravity environment. Pharao is a laser cooled cesium clock that has been specially designed for operation in the space and is managed by the European Space Agency (ESA). The Cold Atom Clock Experiment in Space (CACES) has been the first to demonstrate the operation of the space cold atom clock launched in September, 2016 with the Chinese Space Lab, Tiangong-2. However, the operation modes of the microwave resonant cavities of the French Pharao and the Chinese CACES are similar to that of the ground fountain clock. First, the atoms are cooled in the cooling zone of the vacuum chamber; then, the atom sample is launched by moving molasses. During the traveling, the cold atoms successively pass through a state selection cavity, a ring microwave resonant cavity for the Ramsey interrogation, and a state detection zone.

According to the operation mode, the stability of the space cold atomic clock is mainly affected by two factors. The first factor is the quantum noise which is related to the atomic number; and the second factor is the Dick effect which is introduced by the local oscillator and related to the oscillator noise and the clock cycle parameter. For the separated design of the cooling zone and the Ramsey interrogation in the cold atom clock, there are the following disadvantages:

(1) The loss in the atom number is large in the traveling of the atom sample. During the flight of the cold atoms from the cooling zone to the detection zone, the number of the cold atoms decreases due to thermal expansion and collision with the background gas, while the quantum projection noise increases with the decrease in the number of the atoms;

(2) The proportion of the dead time is large in one clock cycle. As a pulsed operation atomic clock, in each clock cycle, the effective atomic frequency discrimination period is the time of atoms interrogation with the microwave. The structural separation of the cooling zone, the selected state, the Ramsey cavity, and the detection zone causes the atoms to stay longer in the non-microwave interaction region. The increase in the proportion of the dead time in the clock cycle leads to the degradation of the stability of the atomic clocks.

SUMMARY OF THE INVENTION

The present invention provides an integrated cold atom clock that captures and cools atoms in the microwave cavity and then carries out microwave interrogation and atomic state detection in-situ in the microwave cavity.

Compared with the conventional cold atom clock, the overall structure of the atomic clock of the present invention is more compact, which is beneficial to space applications and weight reduction. The cycle time and the dead time ratio are reduced. The noise contributed by the Dick effect is decreased. In the case of the same Ramsey line width, the atomic clock of the present invention requires shorter clock period due to the shorter dead time. In summary, the design of the microwave resonant cavity of the present invention has the advantages of smaller quantum projection noise and the Dick effect noise, and the theoretical stability may be further improved by an order of magnitude, which is an innovative and excellent design of the microwave resonant cavity structure.

The microwave resonant cavity of the present invention may simplify the atomic clock structure, reduce quantum projection noise and noise coming from local oscillator because of the Dick effect, and improve the stability limit of the atomic clock.

DETAILED DESCRIPTION OF THE INVENTION AND EMBODIMENTS

Figure 1:
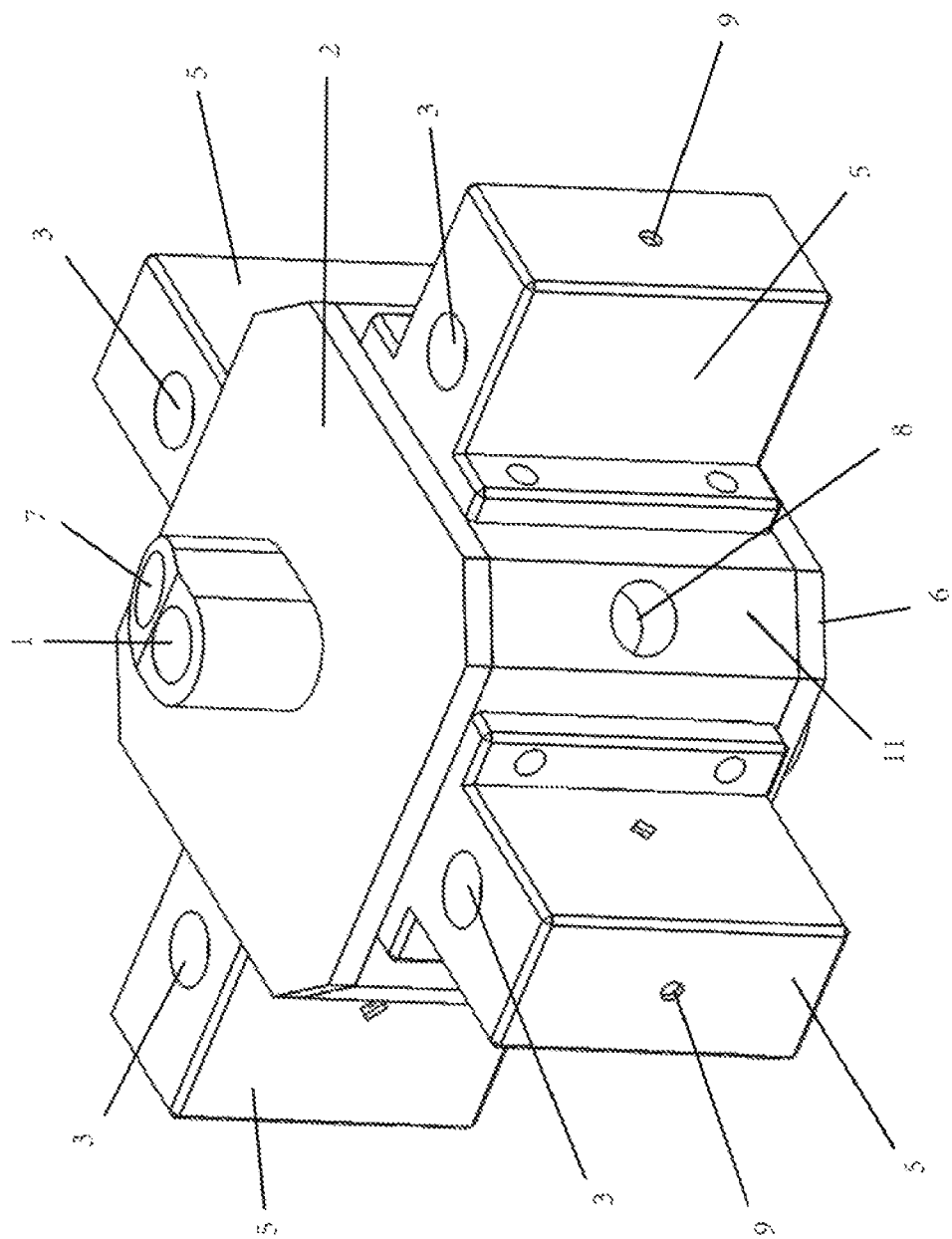
FIG. 1 is a perspective view of a microwave resonant cavity of the present invention that combines laser cooling, microwave interrogation, and atomic state detection in situ.

The present invention provides a microwave resonant cavity for laser cooling, microwave interrogation, and atomic state detection in situ, characterized in that it comprises a microwave resonant cavity body, two cutoff waveguide end covers, and four waveguides for laser beams and microwave coupling. The inner surface of the microwave resonant cavity body is a cylindrical or rectangular cavity, and the outer side surface is an octahedron or other polyhedron. The upper end cover and the lower end cover are respectively mounted on the upper and lower ends of the microwave resonant cavity body. The two end covers are respectively provided with two laser feeding channels along the central axis, and the two ends are further provided with atomic channels. The axis of the atomic channel is at an angle β with the axis of the laser feeding channel, and the angle is in the range of 0°<β<75°. Four side holes are uniformly provided on the circumferential side of the microwave resonant cavity body, and a fluorescence detecting window which is vacuum-tightly mounted with a fluorescent lens is disposed in the same plane between each two adjacent side holes. The fine adjustment of the resonant frequency of the microwave resonant cavity is achieved by finely grinding the upper end cover surface and the lower end cover surface.

A waveguide which is rectangular is respectively arranged on the periphery of the microwave resonant cavity body and the side hole. An upper hole is formed on the upper end surface and a reflector is input. The laser light enters the microwave resonant cavity body through the upper hole, the reflector and the side hole, and a microwave coupling hole is arranged on the outer side of the waveguide.

The inner surface dimensions of the upper cover, the lower cover, and the microwave resonant cavity body are determined by a working microwave mode to ensure that there is only one standing wave mode within the cavity.

The microwave resonant cavity and other atomic clock structures form a vacuum sealing structure. The atoms enter the microwave resonant cavity through the atomic channel on the end cover, are cooled by the six laser beams fed through the waveguide, and then pass through the microwave laser in the cavity. In the selected state, the selected atom is subjected to the Ramsey process in the cavity, and then, after the action of the probe light, the upper and lower level signals of the atom are obtained through the fluorescence collecting lens to complete one clock cycle.

It can be seen from the above process that the technical effects of the present invention are:

(1) The present invention greatly simplifies the spatial atomic clock structure. By combining the laser feeding channel and the microwave feeding inlet, in the case of cooling in the microwave resonant cavity, the microwave has no obvious influence, the overall clock structure is more compact and effective, the volume and weight are compressed, and the miniaturization is realized which is conducive to the space application of atomic clocks.

(2) It can effectively reduce the quantum projection noise. The cooling, state selection, interrogation and detection of the atoms of the microwave resonant cavity structure are all in the same cavity. After the thermal expansion of the atoms, it is not affected by the detection and path window shear, and the atomic number loss is relatively reduced by at least one order of magnitude.

(3) It can effectively reduce the Dick effect. Compared to the conventional cold atom clock, the integrated laser-cooled microwave resonant cavity dead time (time outside the Ramsey effect in the clock cycle) can be reduced to less than a third, which can significantly reduce the noise caused by the Dick effect of the local oscillator.

The present invention is further illustrated by the following examples and drawings but should not be construed as limiting the scope of the present invention.

Figure 2:
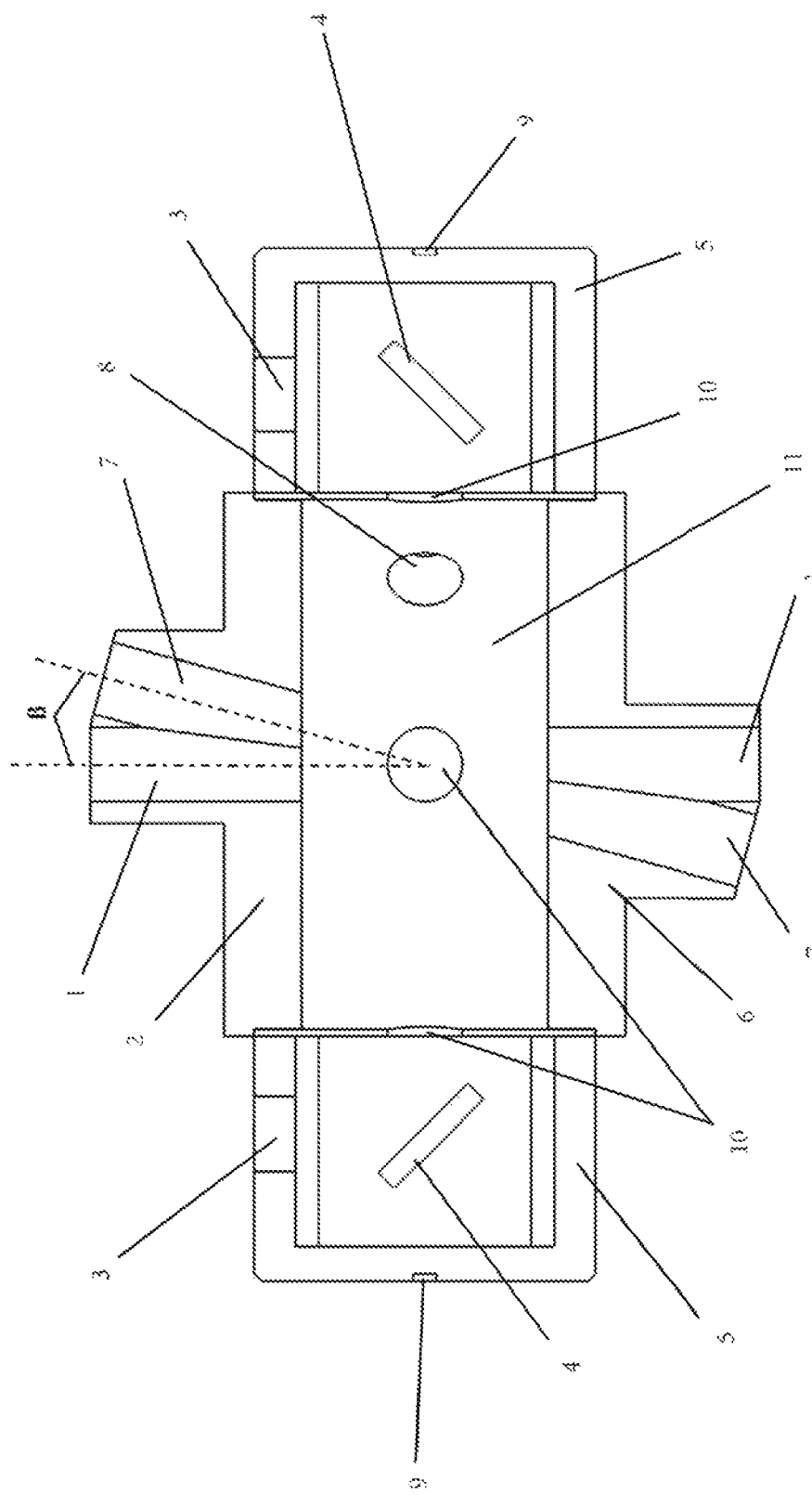
FIG. 2 is a cross-sectional view of a central axis of a microwave resonant cavity of the present invention for laser cooling, microwave interrogation and atomic state detection in situ.

Referring to FIG. 1 and FIG. 2, the microwave resonant cavity of the present invention includes laser cooling, microwave interrogation and atomic state detection in situ, including a microwave resonant cavity body 11, an upper end cover 2, a lower end cover 6, and four waveguides 5.

The inner surface of the microwave resonant cavity body 11 is a cylindrical or rectangular cavity, and the outer side surface is an octahedron or other polyhedron. The upper end cover 2 and the lower end cover 6 are respectively mounted on the upper and lower ends of the microwave resonant cavity body 11, respectively. The covers are respectively provided with two laser feeding channels 1 along the central axis which is the longitudinal axis in the center and along the same longitudinal direction of the laser feeding channels 1, and the upper and lower parts of the atomic channels 7 are further disposed on the two ends of the cover, and the axis of the atomic channels 7 is at an angle β with the axis of the laser feeding channel 1, the angle of the angle is 0°<β<75°, and four side holes 10 are uniformly provided on the circumferential side of the microwave resonant cavity body, in the same plane between each two adjacent side holes 10. A fluorescent detection window 8 is disposed, and the fluorescent detection window 8 is vacuum-tightly mounted with a fluorescent lens, and fine adjustment of the resonant frequency of the microwave resonant cavity is achieved by finely grinding the upper cover surface 2 and the lower cover surface 6.

A waveguide 5 which is rectangular is disposed on the periphery of the microwave resonant cavity body 11 and the side hole 10. An upper hole 3 is defined in the upper end surface thereof, and a reflector 4 is input. The input laser light enters the microwave resonant cavity body 11 through the upper hole 3, the reflector 4 and the side hole 10, and a microwave coupling hole 9 is disposed on an outer side of the waveguide 5.

The inner surface dimensions of the upper end cover 2, the lower end cover 6 and the microwave resonant cavity body 11 are determined by the working microwave mode to ensure that there is only one standing wave mode within the cavity.

Figure 3:
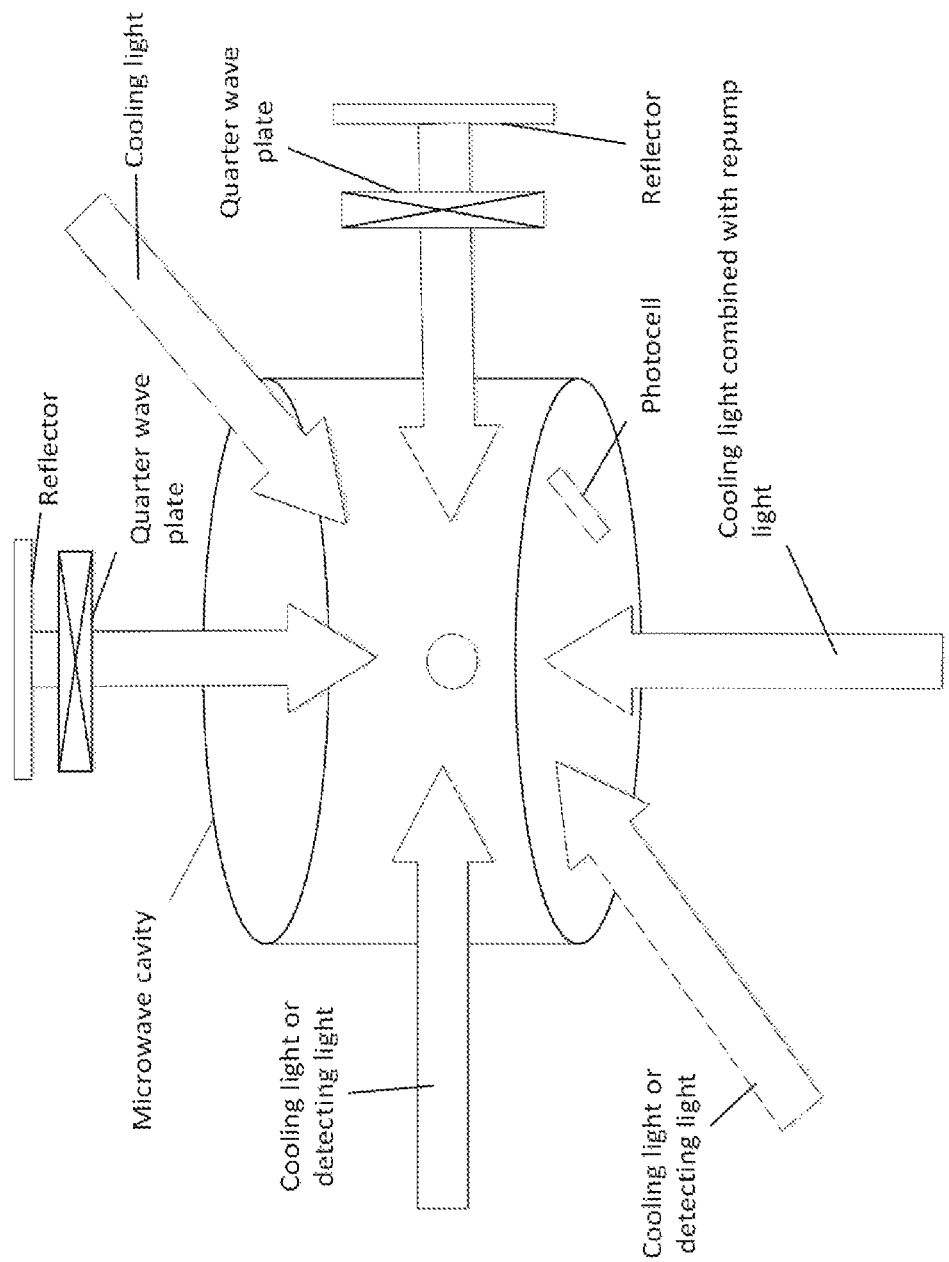
FIG. 3 is a functional schematic diagram showing the functioning and structure of the microwave resonant cavity in one embodiment of the present invention, including the microwave resonant cavity for laser cooling, microwave interrogation, and atomic state detection in situ.

FIG. 3 shows the schematic illustration of a microwave resonant cavity of the present invention that combines laser cooling, microwave interrogation, and atomic state detection in situ. The atomic clock cycle process includes atomic cooling trapping, state selection, microwave interrogation and detection. During the atomic cooling trapping process, six red detuned cooling lasers are fed through the waveguides 5 of the present invention, and the atoms are cooled and trapped. Then, the selected microwave is fed through the waveguides 5, and the atom is prepared to the required magnetic energy level. A cooling optical channel is multiplexed as the selective light entrance, the atoms on the unwanted magnetic sub-levels are pushed away. And then the microwave of the Ramsey effect is fed through waveguides 5. After two atomic interactions with microwaves, the multiplexed one of the cooling optical channels feeds the probe light and forms a standing wave light field with the reflected light. Detect the energy level on the atom, collect the fluorescence signal through the phototube of the fluorescence detection window 8, and then turn off the detection light, turn on the repump light to pump all the lower level atoms to the upper level, repeat the previous upper level detection process to obtain the lower level atomic number fluorescence signal thereby completing the entire clock cycle. It can be seen from the clock cycle that since the atoms are always in the cavity after entering the microwave resonant cavity. The volume of the atomic thermal expansion is not sheared by the flight path which greatly preserves the number of atoms, and because of the lack of flight, the atom cooling, state preparation and state detection time before and after the Ramsey effect can be greatly compressed so that the dead time ratio is also greatly reduced.

The fluorescence detection window 8 is a mounting window of the fluorescence detecting lens and the phototube, and two or four fluorescent detection windows symmetrically can improve the fluorescence collection efficiency.

The specific use of the present invention is:

The initially cooled atomic group enters the microwave resonant cavity through the atomic channel 7, and the six-beam red detuned cooling laser is fed through the waveguides 5 of the present invention. After the cooled atomic is trapped, the selected microwave is fed through the waveguides 5. The atoms are prepared to the desired magnetic energy level, and then a cooled optical channel is multiplexed as a selective light entrance, the atoms on the unwanted magnetic sub-levels are pushed away. Then, the Ramsey-acting microwave is fed through the waveguides 5. After two atomic interactions with microwaves, again use a cooling light channel coupled into the probe light, and form a standing wave light field with the reflected light, detect the energy level on the atom, collect fluorescent signals through the phototubes of the fluorescence detection window 8, then turn off the detection light, turn on the repump light, pump all the lower level atoms to the upper level and repeat the previous upper level detection process, and obtain the lower level atomic number fluorescent signal thereby the entire clock cycle of the atomic clock is completed in the present invention. The highly integrated microwave resonant cavity simplifies the atomic clock physics system and enhances the theoretical limit performance which is very beneficial for space applications.

We claim:

1. A microwave resonant cavity for laser cooling, microwave interrogation, and atomic state detection, comprising:
   a microwave resonant cavity body having an inner surface, an outside, an upper end, a lower end, and a circumferential side,
   an upper end cover,
   a lower end cover, and
   four waveguides, each of the waveguides having an upper surface and an outer side,
   wherein the inner surface of the microwave resonant cavity body is a cylindrical or rectangular cavity, and the outside of the microwave resonant cavity body is a polyhedron,
   the upper end cover and the lower end cover are respectively mounted on the upper end and the lower end of the microwave resonant cavity body,
   two laser feeding channels, a first one of the laser feeding channels is provided on the upper end cover along the central axis, and a second one of the laser feeding channels is provided on the lower end cover along the central axis,
   two atomic channels are respectively provided on the upper end cover and the lower end cover, and an axis of the atom channel is at an angle $\beta$ with the axis of the laser feeding channel,
   four side holes are uniformly provided on the circumferential side of the microwave resonant cavity body, and a fluorescence detection window is provided in a same plane between each two adjacent side holes and each of the fluorescence detection window is vacuum-tightly mounted with a fluorescent lens,
   each of the waveguides is adjacent to two side holes around the microwave resonant cavity body,
   each of the waveguides is rectangular, has an upper hole on the upper surface and a reflector built inside, and a microwave coupling hole arranged on the outer side of the waveguide,
   wherein an input laser sequentially passes through the upper hole of the waveguide, the reflector, and the side hole, and enters the microwave resonant cavity body.

2. The microwave resonant cavity of claim 1, wherein the outside of the microwave resonant cavity body is an octahedron.

3. The microwave resonant cavity of claim 1, wherein the angle $\beta$ is in a range of 0° to 75°.

4. The microwave resonant cavity of claim 1, wherein fine adjustment of resonant frequency of the microwave resonant cavity is achieved by finely grinding surface of the upper end cover and surface of the lower end cover.

5. The microwave resonant cavity of claim 1, wherein a dimension of an inner surface of the upper end cover, the lower end cover, and the microwave resonant cavity body is determined by a working microwave mode to ensure that there is only one standing wave mode in the microwave resonant cavity.

6. A cold atom clock, comprising
   the microwave resonant cavity of claim 1.

* * * * *